US012719233B2

(12) United States Patent
Morizumi et al.

(10) Patent No.: US 12,719,233 B2
(45) Date of Patent: Aug. 25, 2026

(54) NITRIDE SEMICONDUCTOR LASER ELEMENT

(71) Applicant: NICHIA CORPORATION, Anan (JP)

(72) Inventors: Tomonori Morizumi, Anan (JP); Teruyuki Morito, Anan (JP)

(73) Assignee: NICHIA CORPORATION, Anan (JP)

( * ) Notice: Subject to any disclaimer, the term of this patent is extended or adjusted under 35 U.S.C. 154(b) by 404 days.

(21) Appl. No.: 18/062,520

(22) Filed: Dec. 6, 2022

(65) Prior Publication Data

US 2023/0178959 A1 Jun. 8, 2023

(30) Foreign Application Priority Data

Dec. 7, 2021 (JP) ................................ 2021-198292
Sep. 26, 2022 (JP) ................................ 2022-152414

(51) Int. Cl.
*H01S 5/028* (2006.01)
*H01S 5/22* (2006.01)
*H01S 5/343* (2006.01)

(52) U.S. Cl.
CPC .......... *H01S 5/0282* (2013.01); *H01S 5/2201* (2013.01); *H01S 5/343* (2013.01)

(58) Field of Classification Search
CPC .................................. H01S 5/028; H01S 5/22
See application file for complete search history.

(56) References Cited

U.S. PATENT DOCUMENTS 10,559,939 B1 * 2/2020 Raring .................. H01S 5/0287
2003/0210722 A1 * 11/2003 Arakida .................. H01S 5/028 372/49.01

(Continued)

FOREIGN PATENT DOCUMENTS

JP H07-312459 A 11/1995
JP 2006-165478 A 6/2006

(Continued)

OTHER PUBLICATIONS

Merriam-Webster Dictionary definition of “on” (Year: 2025).*
Merriam-Webster “on” definition (Year: 2025).*

*Primary Examiner* — Tod T Van Roy
*Assistant Examiner* — Hunter Jared Nelson
(74) *Attorney, Agent, or Firm* — Spencer Fane LLP

(57) ABSTRACT

A nitride semiconductor laser element includes a nitride semiconductor stack body and a protective film. The nitride semiconductor stack body includes first and second nitride semiconductor layers and an active layer disposed between the first nitride semiconductor layer and the second nitride semiconductor layer. The nitride semiconductor stack body defines a light-emission-side end face intersecting a face of the active layer on a second nitride semiconductor layer side, and a light-reflection-side end face intersecting the face of the active layer on the second nitride semiconductor layer side. The protective film is disposed on the light-emission-side end face of the nitride semiconductor stack body. The protective film includes, in the order from the light-emission-side end face, a first film that is a crystalline film containing oxygen and aluminum and/or gallium, a second film that is a nitride crystalline film, and a third film containing aluminum and oxygen.

20 Claims, 11 Drawing Sheets

(56) References Cited

U.S. PATENT DOCUMENTS

2007/0177646 A1* 8/2007 Sogabe .................. H01S 5/028
372/49.01
2008/0205468 A1* 8/2008 Kawasaki .............. H01S 5/028
372/49.01
2008/0309218 A1 12/2008 Kamikawa et al.
2009/0185595 A1 7/2009 Nakagawa et al.
2009/0213891 A1 8/2009 Nakagawa et al.
2010/0014550 A1* 1/2010 Hasegawa ............ H01S 5/0281
372/49.01
2010/0118908 A1* 5/2010 Kameyama ............ H01S 5/028
372/49.01
2010/0127154 A1* 5/2010 Kameyama ............ H01S 5/028
372/49.01
2012/0093186 A1* 4/2012 Murayama ............ B82Y 20/00
372/44.01
2015/0124847 A1* 5/2015 Yoshida ................ B82Y 20/00
372/49.01
2023/0019645 A1 1/2023 Kitagawa et al.

FOREIGN PATENT DOCUMENTS

JP 2007-201373 A 8/2007
JP 2008-016685 A 1/2008
JP 2009-027018 A 2/2009
JP 2009-099958 A 5/2009
JP 2009-099959 A 5/2009
JP 2009-170801 A 7/2009
JP 2009-176812 A 8/2009
JP 2012-059817 A 3/2012
JP 2014-236052 A 12/2014
WO 2021/200328 A1 10/2021

* cited by examiner

NITRIDE SEMICONDUCTOR LASER ELEMENT

CROSS-REFERENCE TO RELATED APPLICATION

This application claims priority to Japanese Patent Application No. 2021-198292 filed on Dec. 7, 2021, and Japanese Patent Application No. 2022-152414 filed on Sep. 26, 2022, the disclosures of which are hereby incorporated herein by reference in their entireties.

BACKGROUND

The present disclosure relates to a nitride semiconductor laser element.

SUMMARY

In recent years, a wide variety of light emitting devices used in lighting or the like by utilizing the emitted excitation light from a semiconductor laser provided as an excitation light source have been proposed.

Japanese Patent Publication No. 2009-99959 proposes for such a light emitting device a nitride-based semiconductor laser element in which the detachment of the protective film formed on the resonator faces is suppressed.

On the other hand, for a high output semiconductor laser, in particular, catastrophic optical damage (COD) is one of the limiting factors for increasing the output. In other words, there is a desire for a higher output high-performance semiconductor laser element with less catastrophic optical damage.

A nitride semiconductor laser element according to one embodiment of the present disclosure includes a nitride semiconductor stack body and a protective film. The nitride semiconductor stack body includes a first nitride semiconductor layer of a first conductivity type, a second nitride semiconductor layer of a second conductivity type different from the first conductivity type, and an active layer disposed between the first nitride semiconductor layer and the second nitride semiconductor layer. The nitride semiconductor stack body defines a light-emission-side end face intersecting a face of the active layer on a second nitride semiconductor layer side, and a light-reflection-side end face intersecting the face of the active layer on the second nitride semiconductor layer side. The protective film is disposed on the light-emission-side end face of the nitride semiconductor stack body. The protective film includes, in the order from the light-emission-side end face, a first film that is a crystalline film containing oxygen and aluminum and/or gallium, a second film that is a nitride crystalline film, and a third film containing aluminum and oxygen.

According to an embodiment of the present disclosure, a nitride semiconductor laser element with less catastrophic optical damage can be provided.

EMBODIMENTS

Figure 1A:
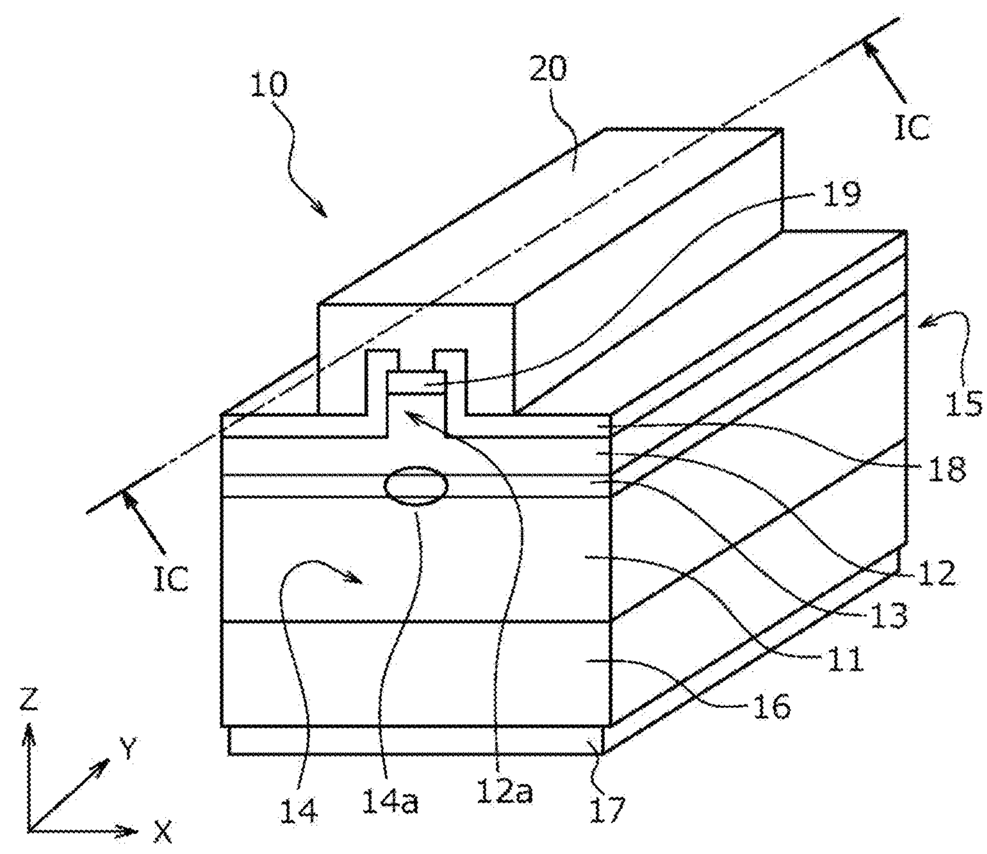
FIG. 1A is a perspective view of a nitride semiconductor laser element according to one embodiment of the present disclosure.

Certain embodiments of the present disclosure will be explained below with reference to the accompanying drawings. The embodiments described below are illustrations provided for the purpose of giving shape to the technical ideas of the present invention, and the present invention is not limited to the embodiments described below. In the explanation below, the same designations and reference numerals denote identical members or similar member, for which redundant explanation will be omitted as appropriate.

Figure 1B:
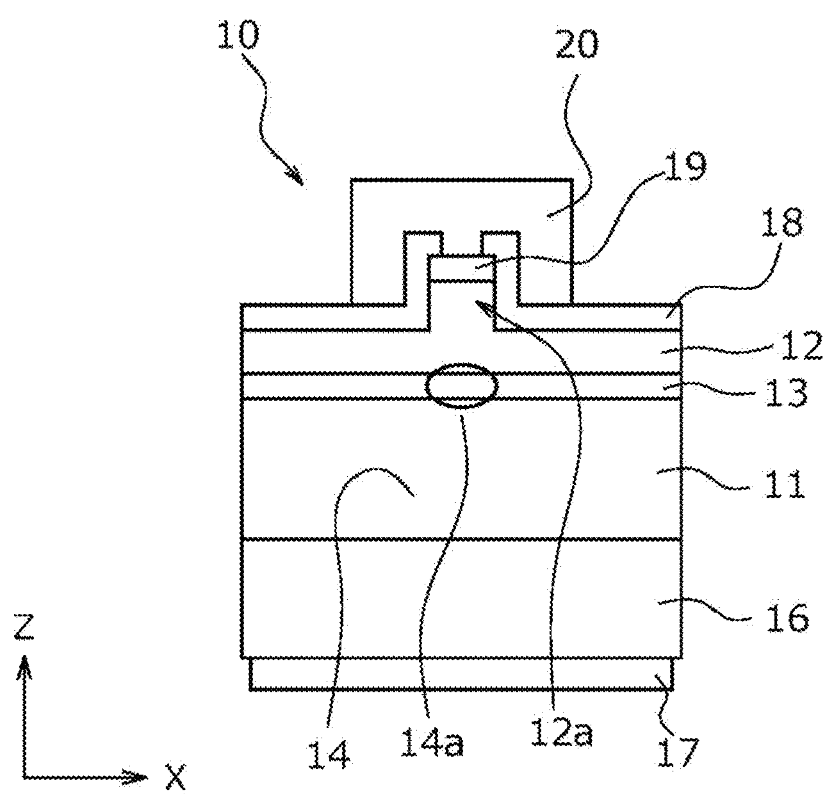
FIG. 1B is a front view of the nitride semiconductor laser element in FIG. 1A.
Figure 1C:
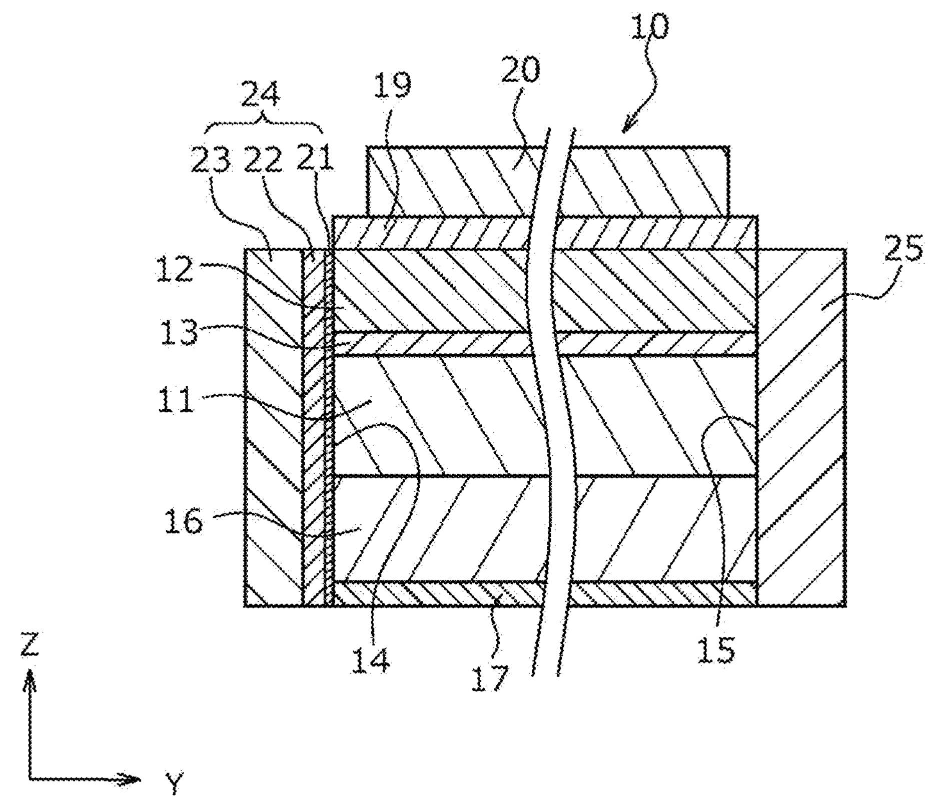
FIG. 1C is a cross-sectional view taken along line IC-IC in FIG. 1A.

A nitride semiconductor laser element (hereinafter, occasionally referred to as a semiconductor laser element) according to one embodiment is shown in FIG. 1A to FIG. 1C. FIG. 1A is a perspective view of the nitride semiconductor laser element according to the embodiment. FIG. 1B is a front view of the nitride semiconductor laser element in FIG. 1A. FIG. 1C is a cross-sectional view taken along line IC-IC in FIG. 1A. In FIG. 1A and FIG. 1B, the protective film 24 and the protective film 25 are not shown.

The nitride semiconductor laser element 10 is an edge-emitting laser element. The nitride semiconductor laser element 10 has a first nitride semiconductor layer 11, a second nitride semiconductor layer 12, an active layer 13 disposed between the first nitride semiconductor layer 11 and the second nitride semiconductor layer 12, and a protective film 24. The first nitride semiconductor layer 11, the active layer 13, and the second nitride semiconductor layer 12 have a light-emission-side end face 14 and a light-reflection-side end face 15 as the faces that intersect the face of the active layer 13 on the second nitride semiconductor layer 12 side. The stack body which includes the first nitride semiconductor layer 11, the active layer 13, and the second nitride semiconductor layer 12 may occasionally be referred to as a nitride semiconductor stack body.

A protective film 24 is disposed on the light-emission-side end face 14. The protective film 24 includes, successively from the light-emission-side end face 14 side, a first film 21 containing oxygen and aluminum and/or gallium, a second film 22 formed of nitride, and a third film 23 containing aluminum and oxygen. The first film 21 and the second film 22 are crystalline films.

With such a structure, the occurrence of catastrophic optical damage in the nitride semiconductor laser element 10 can be reduced. The possible reasons for this effect are as follows. First, because the first film 21 in the protective film 24 is a film containing oxygen, resistance during operation is less likely to be changed, i.e., the resistance is less likely to be reduced. Furthermore, the third film 23 containing oxygen makes it less likely to be oxidized. Moreover, because the nitride second film 22 is interposed between the first film 21 and the third film 23, the second film 22 is less likely to react with ambient oxygen to oxidize and expand. The first film 21 being a crystalline film facilitates the formation of a crystalline second film 22, and makes the oxidation reaction between the first film 21 and the end faces of the nitride semiconductor stack body unlikely. Moreover, the crystalline second film 22 can function as an oxygen barrier layer, thereby making the light-emission-side end face 14 less likely to be oxidized by the oxygen from the third film 23 or the outside of the nitride semiconductor laser element 10. As a result of these, the occurrence of catastrophic optical damage (COD) is believed to be effectively reduced. Reducing the occurrence of catastrophic optical damage can extend the service life of the nitride semiconductor laser element 10. Such an effect becomes prominent particularly in a high output nitride semiconductor laser element 10. A high output nitride semiconductor laser element 10 is an element having 2 $MW/cm^2$ or higher light density, for example. The light density of the nitride semiconductor laser element 10 may be 200 $MW/cm^2$ or lower. A high output nitride semiconductor laser element 10 is an element outputting 1 W or higher, for example, in the case of a multi-transverse mode, and may be an element outputting 5 W or higher. A high output nitride semiconductor laser element 10 is an element outputting 0.1 W or higher, for example, in the case of a single transverse mode. The output of the nitride semiconductor laser element 10 may be 3 W or lower.

First Nitride Semiconductor Layer 11, Active Layer 13, and Second Nitride Semiconductor Layer 12

A first nitride semiconductor layer 11, an active layer 13, and a second nitride semiconductor layer 12 are stacked in that order. A nitride semiconductor stack body which includes these semiconductor layers can be formed on a substrate 16.

The first nitride semiconductor layer 11 is of a first conductivity type, and the second nitride semiconductor layer 12 is of a second conductivity type. The first conductivity type may be n-type or p-type. The second conductivity type means a different conductivity type form the first conductivity type. The first nitride semiconductor layer 11, the active layer 13, and the second nitride semiconductor layer 12 can be formed with semiconductor layers made of $In_xAl_yGa_{1-x-y}N$ ($0 \leq x \leq 1$, $0 \leq y \leq 1$, $0 \leq x+y \leq 1$). The first nitride semiconductor layer 11 and the second nitride semiconductor layer 12 may contain one or more n-type impurities, such as Si, Ge, and the like. The first nitride semiconductor layer 11 and the second nitride semiconductor layer 12 may contain one or more p-type impurities, such as Mg, Zn, and the like. The impurity content can be set, for example, in a range of $5 \times 10^{16}/cm^3$ to $1 \times 10^{21}/cm^3$. The first nitride semiconductor layer 11 and the second nitride semiconductor layer 12 may include an undoped layer. An undoped layer refers to a layer to which no n-type or p-type impurity is intentionally added. An undoped layer may have an impurity concentration below the detectable limit in a secondary ion mass spectroscopy (SIMS) analysis or the like, or an impurity concentration lower than $1 \times 10^{16}/cm^3$. The first nitride semiconductor layer 11 and the second nitride semiconductor layer 12 may each have one semiconductor layer only, but preferably have two or more layers.

The peak oscillation wavelength of the semiconductor laser formed by the first nitride semiconductor layer 11, the active layer 13, and the second nitride semiconductor layer 12 is 200 nm to 700 nm, for example.

First Nitride Semiconductor Layer 11

A first nitride semiconductor layer 11 can have a multilayer structure composed of nitride semiconductors, such as GaN, InGaN, AlGaN, or the like. The first nitride semiconductor layer 11, if formed on a substrate 16, can have an underlayer, a clad layer, an intermediate layer, a light guide layer, or the like. It may include a semiconductor layer other than these.

Active Layer 13

An active layer 13 has a quantum well structure. The active layer 13 may have a multiple quantum well structure or a single quantum well structure.

The active layer 13 can have a multilayer structure composed of nitride semiconductors, such as GaN, InGaN, or the like. In the case where the active layer 13 has a multiple quantum well structure, it can have, successively from the first nitride semiconductor layer 11 side, a well layer, an intermediate barrier layer, and a well layer. It may have a plurality of well layers and a plurality of intermediate barrier layers. A well layer is, for example, an InGaN layer. An intermediate barrier layer is, for example, an InGaN layer or a GaN Layer. The active layer 13 is, for example, an undoped layer.

The composition of the active layer 13 can be suitably adjusted according to the oscillation wavelength of the nitride semiconductor laser element to be obtained. For example, the well layers can be $In_xGa_{1-x}N$ layers or the like. The composition ratio x can be selected in a range of the 0.01 to 0.50. This can set the peak oscillation wavelength of the semiconductor laser in a range of the 360 nm to 700 nm. The well layers may be GaN or AlGaN layers.

Second Nitride Semiconductor Layer 12

A second nitride semiconductor layer 12 can have a multilayer structure composed of nitride semiconductors, such as GaN, InGaN, AlGaN, or the like. Examples of the second nitride semiconductor layer 12 include those having a clad later, a light guide layer, or the like. It may include a semiconductor layer other than these.

As long as an edge-emitting laser element can be constructed, the second nitride semiconductor layer 12 may have a ridge **12*a* on the surface, i.e., the upper face, or a current constriction layer known in the art formed in the second nitride semiconductor layer 12. For example, the second nitride semiconductor layer 12 is a p-type semiconductor layer, and has a ridge 12*a* formed on the upper face. The second nitride semiconductor layer 12** may be an n-type semiconductor layer.

The ridge **12*a* functions as an optical waveguide region, and has a width of 1 μm to 30 μm, for example. The width of the ridge 12*a* can be set to 1.5 μm to 500 μm in the case of driving a nitride semiconductor laser element 10 as a high output element. The height of the ridge is 0.1 μm to 2 μm, for example. By adjusting the thicknesses of and the materials for the layers constituting the second nitride semiconductor layer 12, the extent of the light confinement effect can be suitably adjusted. The ridge 12*a* can be 200 μm to 5000 μm in length in the direction of the oscillator. The ridge 12*a*** does not have to have a constant width across the length in the direction of the oscillator, and may have perpendicular or tapered lateral faces. The taper angle in this case, for example, is 45 degrees or greater but smaller than 90 degrees.

The crystal planes of the layer forming surfaces of the first nitride semiconductor layer 11, the active layer 13, and the second nitride semiconductor layer 12 are not particularly limited, and may be C-plane {0001}, M-plane {1-100}, A-plane {11-20}, R-plane {1-102}, or any other plane. For example, the upper face of the second nitride semiconductor layer 12 is C-plane. According to the crystallography notation in expressing crystal planes and directions, an overbar is applied to 1, for example, to represent the inverse direction of 1, but is expressed as "−1" as a matter of convenience. Coordinates in square brackets [ ] denote an individual orientation, coordinates in angle brackets < > denote a family of orientations, indices in parentheses ( ) denote an individual plane, and indices in curly brackets { } denote a family of planes.

Light-Emission-Side End Face 14 and Light-Reflection-Side End Face 15

A light-emission-side end face 14 and a light-reflection-side end face 15 are the semiconductor layer end faces which respectively include at least the light emission face 14*a*, which is the optical waveguide region of the active layer 13 or the region corresponding to or the NFP (near field pattern), and the light reflecting face at the other end. The light-emission-side end face 14 and the light-reflection-side end face 15 are faces defined by the layer forming faces (the X-Y planes in FIG. 1A) of the first nitride semiconductor layer 11, the active layer 13, and the second nitride semiconductor layer 12. The light-emission-side end face 14 and the light-reflection-side end face 15 may be oblique to the stacking direction of the semiconductor layers (the arrow Z direction in FIG. 1A), but are preferably in parallel therewith. They are preferably perpendicular to the semiconductor layer forming faces (the X-Y planes in FIG. 1A). The light-emission-side end face 14 and the light-reflection-side end face 15 are at a position opposite to one another, and are preferably in parallel with one another. A resonator is formed between the light-emission-side end face 14 and the light-reflection-side end face 15. Being "parallel" here includes a variance of up to ±5°. Being "perpendicular" here includes a variance of up to ±5°.

The light-emission-side end face 14 and the light-reflection-side end face 15 may be M-plane {1-100}, A-plane {11-20}, C-plane {0001}, R-plane {1-102}, or other planes. For example, the light-emission-side end face 14 is M-plane. In the case where the light-emission-side end face 14 and the light-reflection-side end face 15 are M-planes, these faces can be obtained by cleaving. Cleaving can be accomplished, for example, by forming a recess by laser processing followed by pressing. The laser scanning direction may be the same as or different from the cleaving direction. The light-emission-side end face 14 does not have to be M-plane in the strict sense.

Protective Film 24

A protective film (a first protective film) on the light-emission-side end face 14 includes, successively from the light-emission-side end face 14 side, a first film 21 containing oxygen and aluminum and/or gallium, a nitride second film 22, and a third film 23 containing aluminum and oxygen. The first film 21 and the second film 22 are crystalline films.

The protective film 24 disposed on the light-emission-side end face 14 covers the face of the resonator formed by the semiconductor layers, but does not necessarily have to cover the entire light-emission-side end face 14. The protective film 24 covers at least the optical waveguide region of the resonator face or the region corresponding to the NFP, i.e., the light emitting face 14*a* that is the end face region including the active layer 13 and some of the upper and lower layers thereof. The protective film 24 may cover the light-emission-side end face 14 in its entirety. A portion of the protective film 24 may be disposed on other faces beside the resonator face, for example, the upper face and lateral faces of the semiconductor layers. The first film 21, the second film 22, and the third film 23 that configure the protective film 24 are each formed with a light transmissive material with respect to the oscillation wavelength of the nitride semiconductor laser element 10.

First Film 21

A first film 21 is a film disposed in contact with the light-emission-side end face 14. "Being in contact" may include not only the case in which the first film 21 is directly in contact with the resonator face, but also the case in which the first film 21 is formed on a thin film formed on the resonator face to the extent of having the effect of the present disclosure. For example, there may be a thin film formed by the ambient gas during the pretreatment of the resonator face or when the film formation is initiated. The thickness of such a thin film is, for example, smaller than the thickness of the first film 21. The thickness of such a thin film is, for example, 3 nm or smaller, or 1 nm or smaller. Such a thin film contains, for example, gallium (Ga) and oxygen (O).

The first film 21 may be an oxide film containing aluminum (Al), oxide film containing Ga, or oxide film containing Al and Ga. An oxide film containing aluminum includes an aluminum oxide film such as $Al_2O_3$. An oxide film containing Ga includes a gallium oxide film such as $Ga_2O_3$. An oxide film containing Al and Ga includes an aluminum gallium oxide film such as AlGaO. Such a film can reduce resistance fluctuations during the operation of the semiconductor laser element. Furthermore, the first film 21 being an oxide film containing Al can facilitate the formation of a crystalline film. The first film 21 is, for example, an $Al_2O_3$ film. The first film 21 may be an insulating film.

The first film 21 is a crystalline (monocrystalline or polycrystalline) film. A single crystal is a material having minimal lattice constant variations or lattice-plane tilting. In other words, atoms are regularly arranged in the material, and long-range order is maintained. A polycrystal is composed of a large number of minute monocrystals, i.e., microcrystals. Such a crystal of a film can be determined by observing an electron diffraction image. An electron diffraction image appears in correspondence with the magnitude of lattice constant and lattice plane orientation when an electron beam is incident on the film. For example, in the case of a single crystal, regularly arranged diffraction points will be observed. In the case of a polycrystal, which is composed of microcrystals, the orientations of lattice planes are not aligned, and thus the electron diffraction image will show complexly merged diffraction points or Debye rings. On the other hand, an amorphous material lacks a long-range periodic structure in the atomic arrangement, not allowing electron diffraction to appear. Accordingly, no diffraction points are observed in the diffraction image. An electron diffraction image can be observed by cutting the end face on which the layer is formed so as to expose a cross section, and irradiating an electron beam thereto. Crystalline differences can also be confirmed by observing a cross section, for example, by using a transmission electron microscope, scanning transmission electron microscope, or scanning electron microscope, or based on the etching rate difference by using an appropriate etchant, such as an acidic or alkaline solution. Alternatively, the atomic arrangement can be confirmed by high-resolution transmission electron microscopy imaging.

Figure 2:
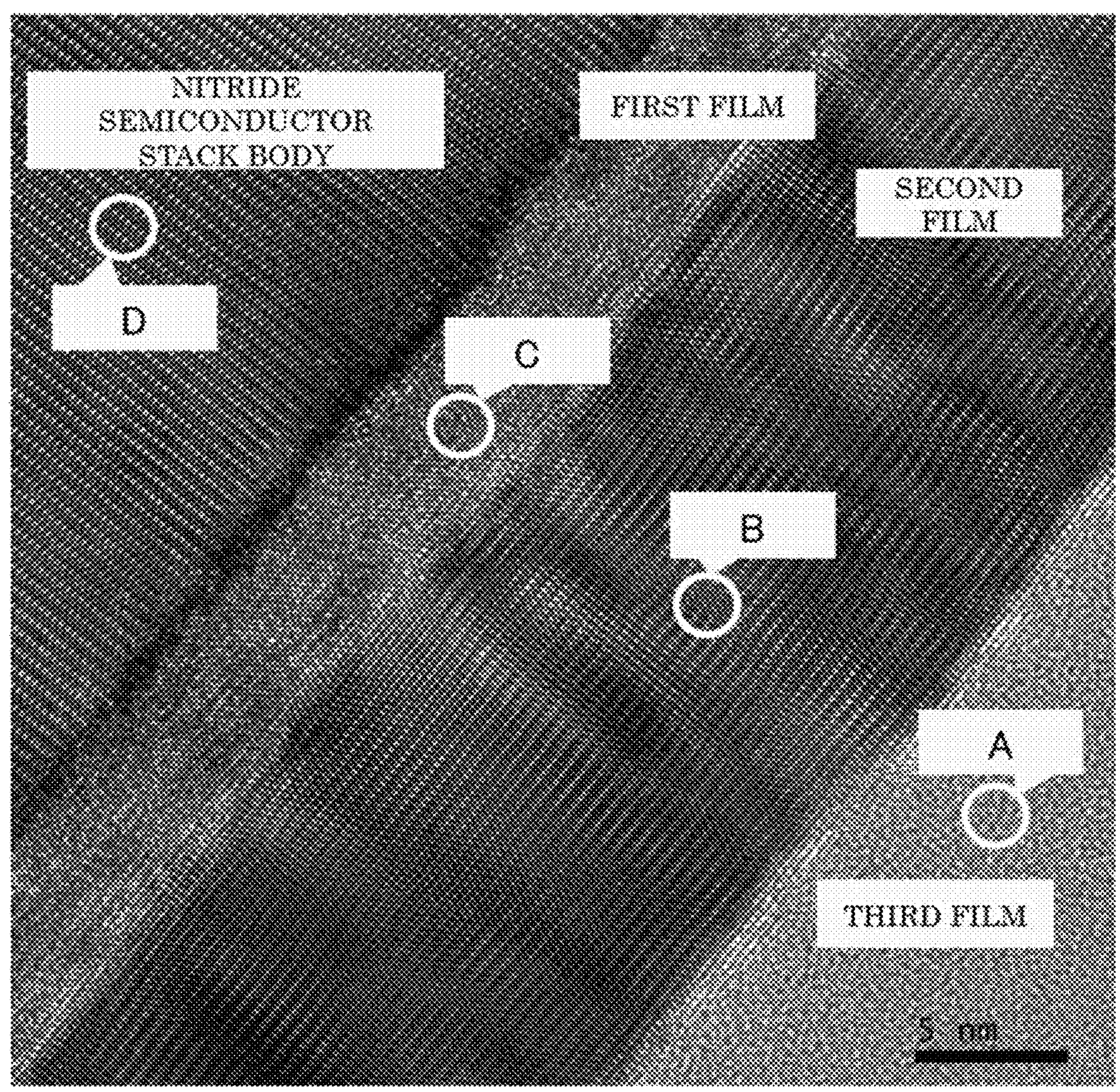
FIG. 2 is a high-resolution transmission electron microscope image of a protective film and its vicinity.
Figure 3A:
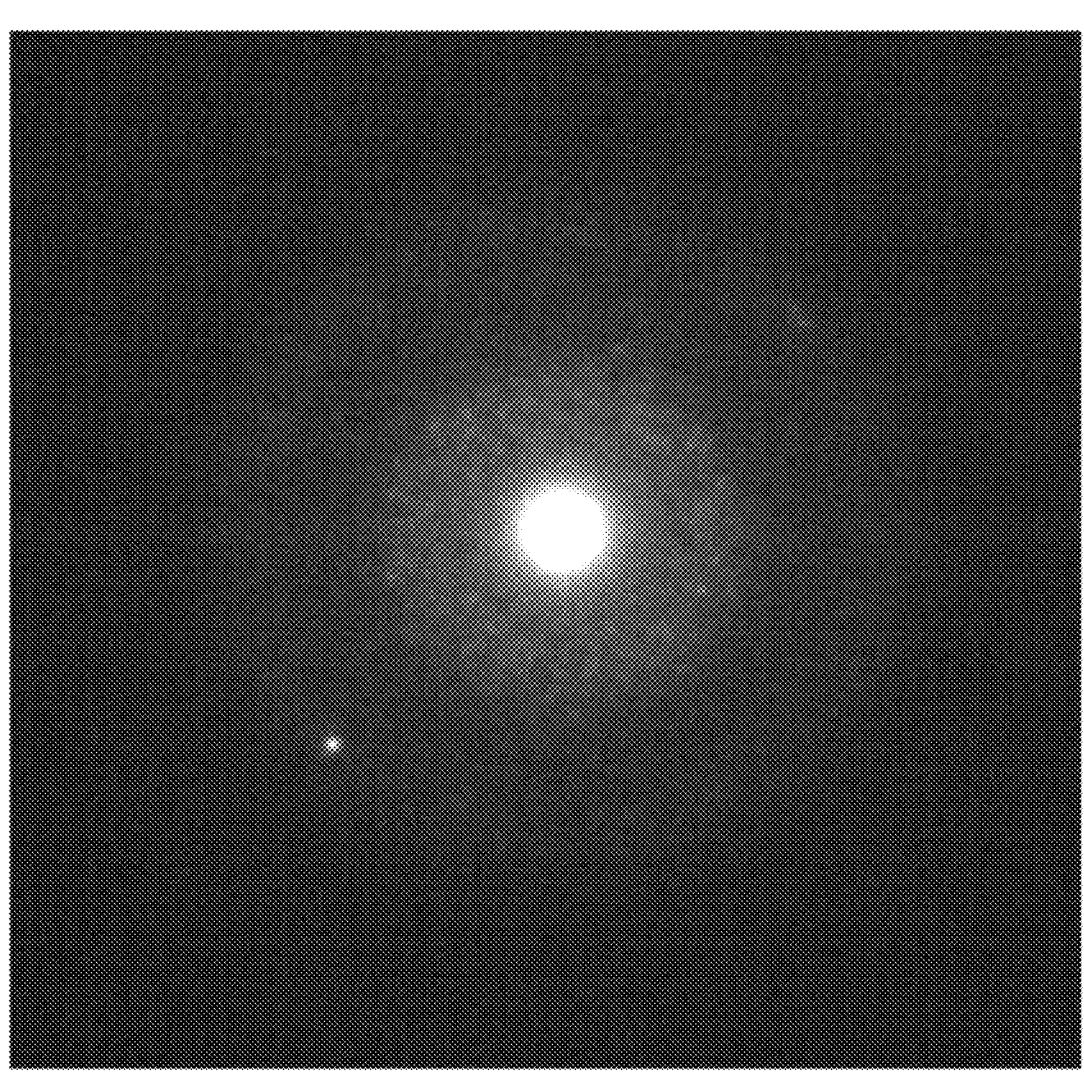
FIG. 3A is an electron beam diffraction image of a third film.
Figure 3B:
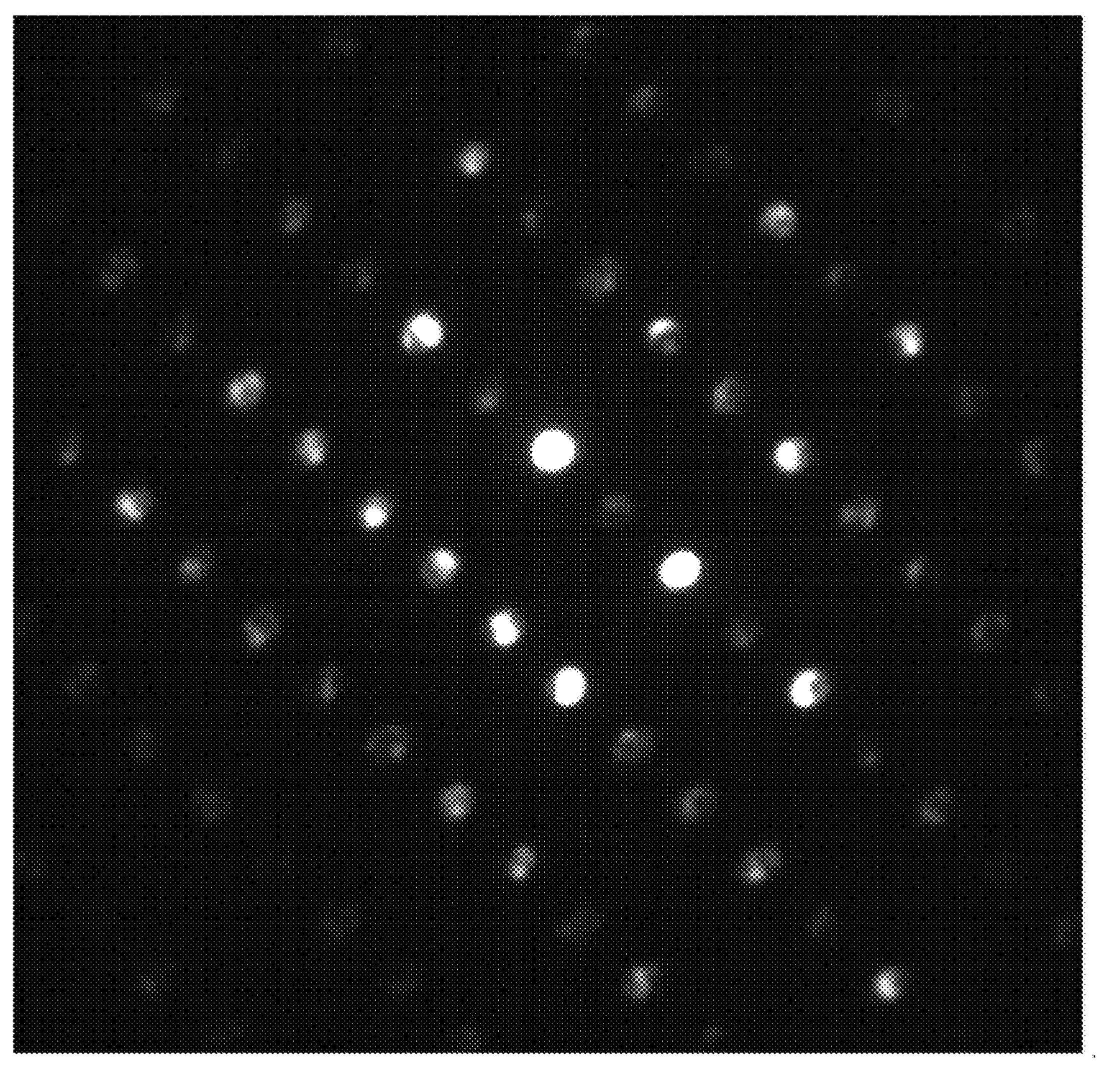
FIG. 3B is an electron beam diffraction image of a second film.
Figure 3C:
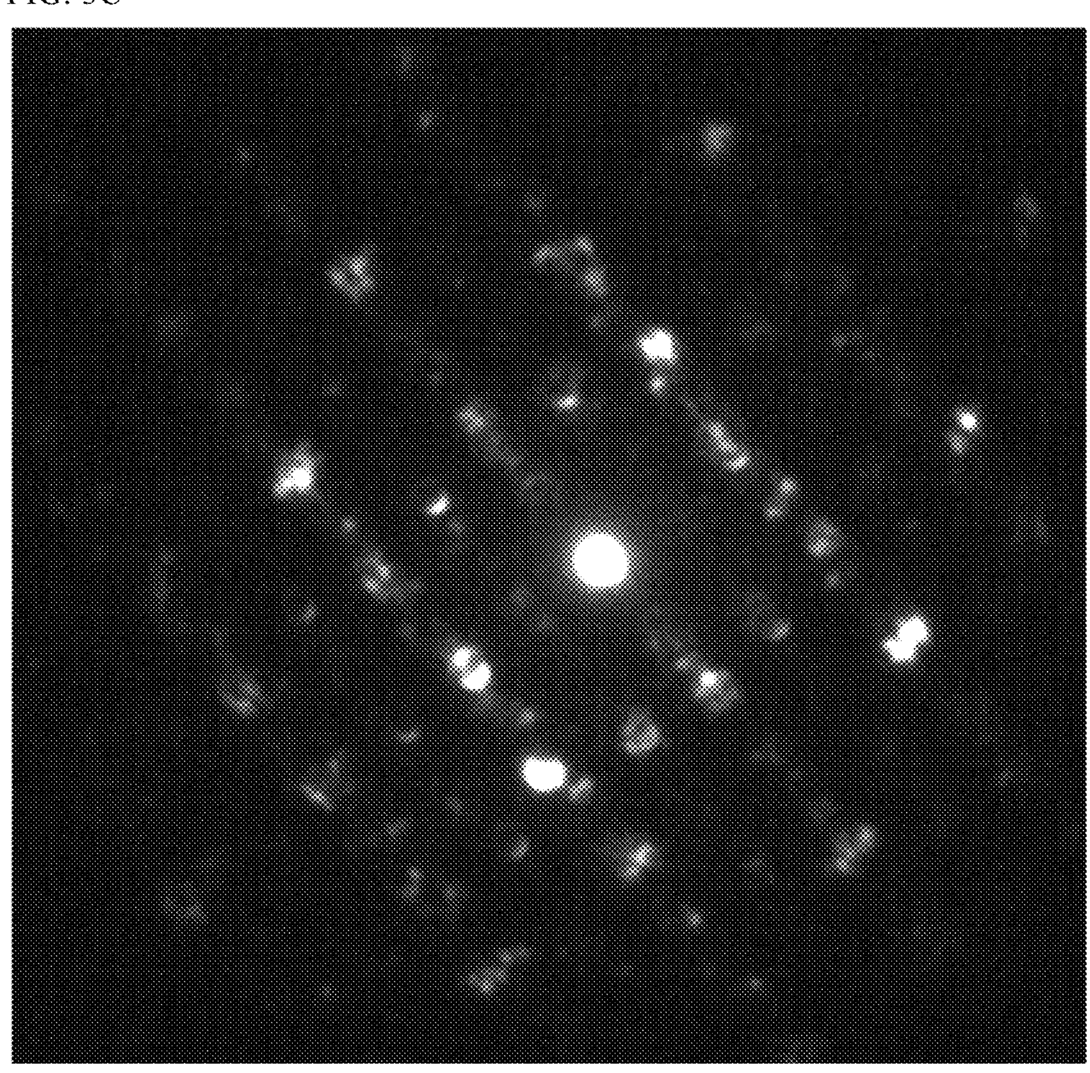
FIG. 3C is an electron beam diffraction image of a first film.
Figure 3D:
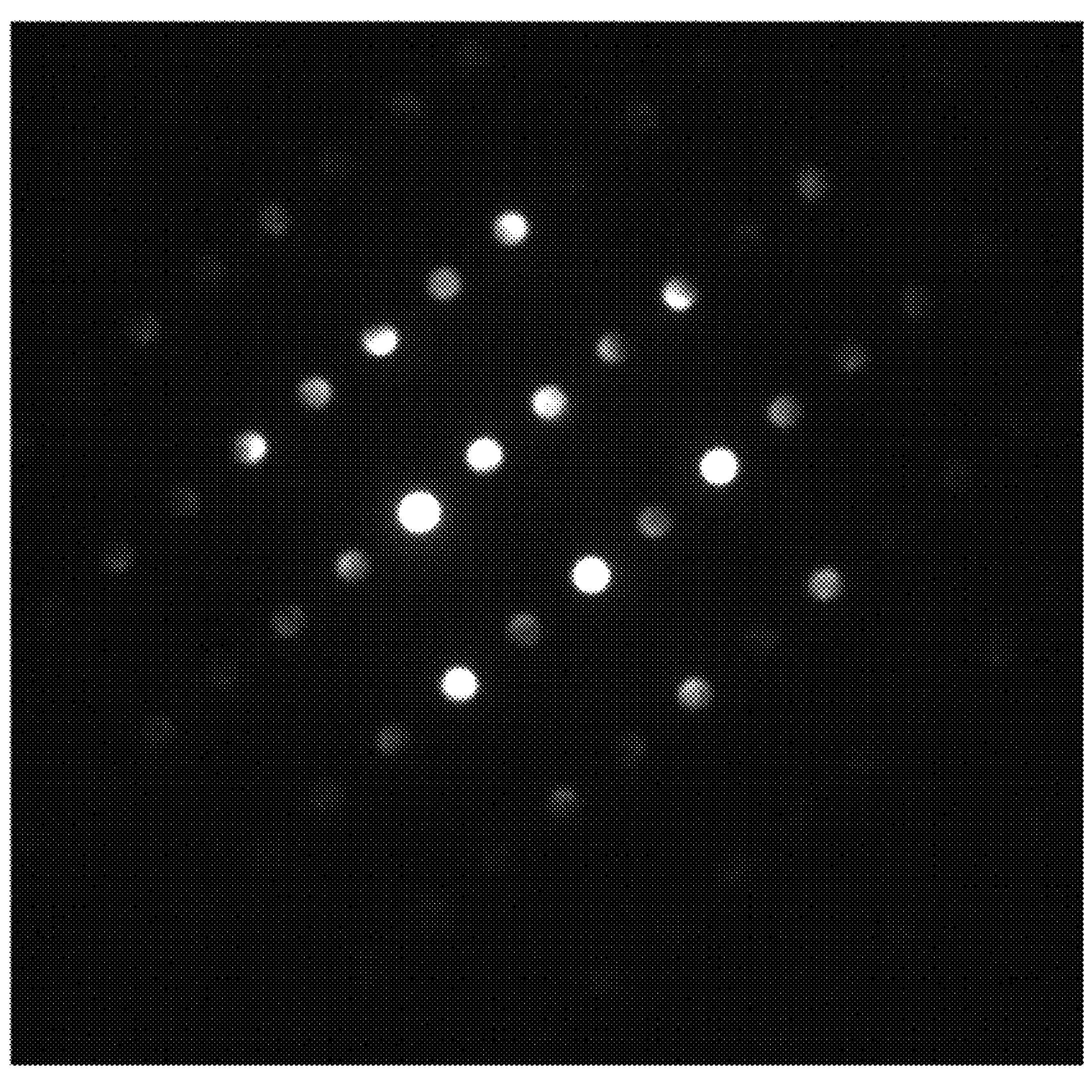
FIG. 3D is an electron beam diffraction image of a nitride semiconductor stack body.

FIG. 2 is an example of a high-resolution transmission electron microscope image of a protective film 24 and its vicinity. The scale bar shown at bottom right in the image denotes 5 nm. The nitride semiconductor stack body shown in FIG. 2 includes an active layer 13. FIG. 3A is an electron diffraction image of the area in the circle A in FIG. 2, which is the electron diffraction image of the third film 23. FIG. 3B is an electron diffraction image of the area in the circle B in FIG. 2, which is the electron diffraction image of the second film 22. FIG. 3C is an electron diffraction image of the area in the circle C in FIG. 2, which is the electron diffraction image of the first film 21. FIG. 3D is an electron diffraction image of the area in the circle D in FIG. 2, which is the electron diffraction image of the nitride semiconductor stack body. FIG. 3C confirms that the first film 21 is crystalline, i.e., the first film 21 is a film having crystalline quality.

Examples of crystal structures for the first film 21 include the cubic crystal system, tetragonal crystal system, hexagonal crystal system, or the like. The materials for, the crystallinity and the orientation of the first film 21 can be selected according to the materials for, the crystallinity and the orientation of the light-emission-side end face 14 on which the first film 21 is to be formed. For example, a crystalline film is a film which includes a single crystal and/or polycrystal in part, or a film composed only of a single crystal or polycrystal. In other words, the first film 21 does not necessarily have to be strictly monocrystalline or polycrystalline, and may be one having a crystal structure similar to these, or one having a crystal structure showing the characteristics of these structures. The crystalline quality of the first film 21 may differ between the optical waveguide region or the region corresponding to the NFP and the areas of the first nitride semiconductor layer 11 and the second nitride semiconductor layer 12 distant from the active layer 13 in the thickness direction. The first film 21 is preferably crystalline practically across the entire thickness in the optical waveguide region or the region corresponding to the NFP. Practically across the entire thickness refers to the portion excluding the portions where the boundaries with adjacent layers are indistinguishable. For example, the first film 21 is a film that is polycrystalline at least in part. The first film 21 may be such that at least one half of the portion adjacent to the active layer 13 is polycrystalline in the cross sections taken in the directions intersecting the principal faces of the active layer 13 and intersecting the light-emission-side end face 14 (e.g., in the directions perpendicular to both).

The thickness of the first film 21 is, for example, 1 nm to 100 nm, preferably 1 nm to 50 nm, more preferably 1 nm to 10 nm. The smaller the thickness of the first film 21, the higher the tendency for achieving good crystalline quality becomes. The thickness of the first film 21 can be set to 5 nm or larger, or 6 nm or larger. It may be set to 8 nm or larger. For example, the thickness of the first film 21 can be set to 5 nm or larger but smaller than 10 nm. Setting the thickness of the first film 21 to 5 nm or larger can further extend the service life of the nitride semiconductor laser element 10. It is likely because this can improve the crystalline quality of the second film 22. The thickness of the first film 21 can be 50 nm or smaller, 20 nm or smaller, 10 nm or smaller, or smaller than 10 nm. For example, the thickness of the first film 21 can be 5 nm or larger and 10 nm or smaller. The thickness of the first film 21 can be 10 nm or smaller, 5 nm or larger and 10 nm or smaller. The thickness of the first film 21 refers to the length in the direction parallel to the principal faces of the active layer 13. Likewise, the thicknesses of the second film 22 and the third film 23 refer to the lengths in the direction parallel to the principal faces of the active layer 13.

A first film 21 can be formed by a method known in the art. For example, pulsed sputtering, electron cyclotron resonance (ECR) sputtering, magnetron sputtering, ion beam assisted deposition, laser ablation, chemical vapor deposition (CVD), or a combination of two or more of these methods can be used. Alternatively, any of these methods can be combined with full or partial pretreatment. For pretreatment, any one or more of the following can be used: inert gas (Ar, He, Xe, or the like) or plasma irradiation, oxygen or ozone gas irradiation, oxidation (heat treatment), and exposure treatment.

A first film 21 is preferably formed by pulsed sputtering or ECR sputtering among them. For example, a first film can be formed by using an ECR sputtering system. This can form a first film 21 of good crystalline quality. In the case of forming a first film 21 by using an ECR sputtering system, the oxygen flow rate during film formation is preferably set to $1.33\times10^{-7}/cm^3$ or higher. Pretreatment may be performed before forming a first film 21. For the pretreatment, the light-emission-side end face 14 can be treated with oxygen plasma. Pulsed sputtering includes one using an oxide target, and one using a non-oxide target intermittently sputtering while irradiating oxygen or plasma, or in oxygen environment. ECR sputtering tends to allow for a lower temperature during film formation than pulsed sputtering. This can reduce the degradation of the properties of the electrodes described later.

Forming a first film 21 as an oxygen-containing film in contact with the light-emission-side end face 14 as described above can reduce resistance fluctuations during the operation of the nitride semiconductor laser element 10. Furthermore, forming a first film 21 as a crystalline film can facilitate the formation of a crystalline second film 22. A first film 21 having a relatively small thickness, for example, thinner than a third film 23, can reduce the stress in the light-emission-side end face 14 attributable to the heat generated during the operation of a nitride semiconductor laser element 10. Moreover, the adhesion between the light-emission-side end face 14 and the protective film 24 can be improved.

Second Film 22

A second film 22 is formed in contact with the first film 21. The second film 22 is a nitride film. A nitride film can specifically be AlN, GaN, AlGaN, or the like. Among them, an AlN film is preferable. Because an AlN film can be formed by ECR sputtering, for example, both the first film 21 and the second film 22 can be formed together by using an ECR sputtering system. The first film 21 and the second film 22 can be grown in a continuous manner.

The second film 22 is a crystalline film. Thus, it can effectively function as an oxygen barrier layer. The second film 22 may be oriented along M axis <1-100>, A axis <11-20>, C axis <0001>, or R axis <1-102>, or have any other orientation in the thickness direction. For example, the second film 22 is C-axis-oriented relative to the M axis of the nitride semiconductor stack body. In this case, the M axis of the nitride semiconductor stack body parallels the C axis of the second film 22. The axial orientation of the crystal in the portion of the second film 22 adjacent to the active layer 13 may be the same as the axial orientation of the crystal in the portion adjacent to the first nitride semiconductor layer 11 and/or the portion adjacent to the second nitride semiconductor layer 12. This makes it easier to form the second film 22 with good crystalline quality. For example, in the second film 22, both the portion adjacent to the active layer 13 and the portion(s) adjacent to the first nitride semiconductor layer 11 and/or the second nitride semiconductor layer 12 are C-axis oriented. For example, the C axis in the portion of the second film 22 adjacent to the active layer 13 and the C axis in the portion(s) of the second film 22 adjacent to the first nitride semiconductor layer 11 and/or the second nitride semiconductor layer 12 are in parallel. A portion of the second film 22 adjacent to a certain layer (e.g., the active layer 13) refers to the portion interposed by the imaginary plane which is an extension of one of the principal faces of the layer and the imaginary plane which is an extension of the other principal face. The axial orientation of the crystal may be the same across the entire second film 22. The crystalline quality of each portion of the second film 22 can be evaluated by using a cross section taken in the direction intersecting the principal faces of the active layer 13 (e.g., perpendicular direction).

The thickness of the second film 22 is, for example, 5 nm to 500 nm, and may be 5 nm to 200 nm, 5 nm to 100 nm, or 5 nm to 50 nm. Setting the thickness of the second film 22 to fall within these ranges can achieve good crystalline quality, and therefor the second film can effectively function as an oxygen barrier layer. The thickness of the second film 22 being 50 nm or smaller is believed to readily reduce crack formation. The thickness of the second film 22 may be larger than 50 nm in order to adjust the reflectivity of the protective film 24.

The second film 22 can be formed by a known method, such as sputtering, ECR sputtering, or the like. Sputtering includes one using a nitride target, and one using a non-nitride target sputtering while irradiating nitrogen gas or plasma, or in nitrogen environment.

With regard to the example of the second film 22 shown in FIG. 2, FIG. 3B confirms that the second film 22 is crystalline, i.e., the second film 22 is a film having crystalline quality.

Third Film 23

A third film 23 is a film formed in contact with the second film 22. The third film 23 is a film containing Al and O. The third film 23 may be an oxide film containing Al or oxynitride film containing Al. The third film 23 may be an aluminum oxide film. Because the third film 23 is less likely to be oxidized with such a composition, the possibility of oxygen reaching the nitride semiconductor stack body can be reduced. The progression of the third film 23 oxidation made of an oxide film containing Al is considered more difficult than an oxynitride film containing Al during the operation of the nitride semiconductor laser element 10. This, as a result, can further extend the service life of the nitride semiconductor laser element 10. The third film 23 is, for example, an $Al_2O_3$ film.

The third film 23 may be a crystalline film or a film which includes an amorphous structure. An amorphous structure means a structure lacking a periodic structure such as the atomic arrangement of a crystal, i.e., the atomic arrangement is irregular or lacks the long-range order. The third film 23 is preferably a film having an amorphous structure, or one that includes an amorphous structure and a crystalline structure. Among them, a film composed only of an amorphous structure is preferable. This makes it easier to make the third film 23 thicker than the thickness(es) of the first film 21 and/or the second film 22. Furthermore, a portion of the third film 23, for example, a portion on the active layer 13 side, can become crystalline during the operation of the nitride semiconductor laser element 10. This can potentially further extend the service life of the nitride semiconductor laser element 10. For example, such crystallization can occur in the case where the third film 23 is made of $Al_2O_3$.

Figure 4:
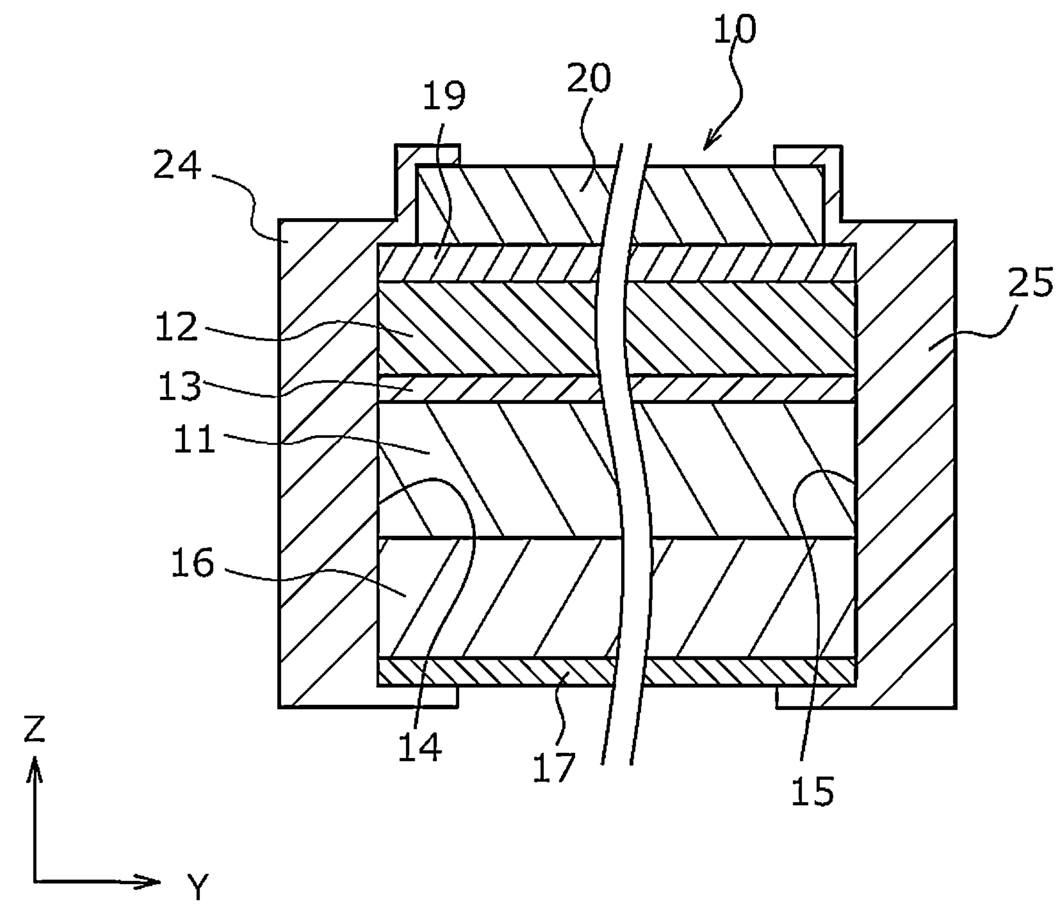
FIG. 4 is a cross-sectional view of another example of the nitride semiconductor laser element 10 according to the present disclosure.
Figure 5:
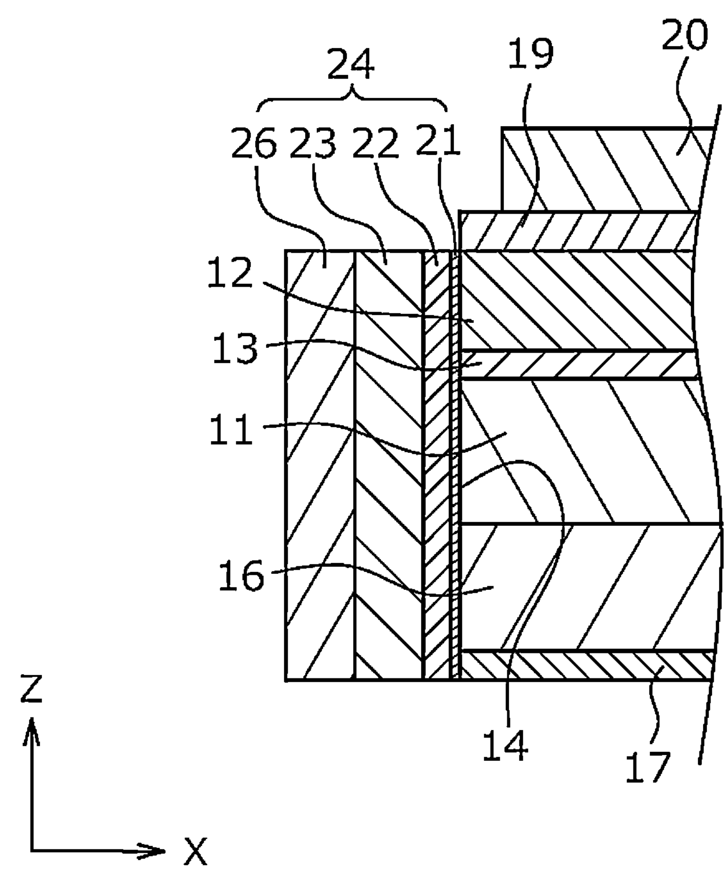
FIG. 5 is an enlarged view showing a portion of another example of a protective film on a side of a light-emission-side end face.

The thickness of the third film 23 is preferably larger than the thickness of the first film 21. The thickness of the third film 23 may be smaller than the thickness of the second film 22, but preferably larger. The thickness of the third film 23 is, for example, three times the thickness of the first film 21 or larger, and may be 10 times or larger. The thickness of the third film 23 is preferably 10 nm to 1000 nm, more preferably 50 nm to 500 nm. Setting the thickness of the third film 23 to fall within such ranges can increase the total thickness of the protective film 24, thereby reducing the possibility of the oxygen from the outside of the nitride semiconductor laser element 10 transmitting through the protective film 24 to reach the nitride semiconductor stack body. This can potentially be beneficial to service life extension. The effect can be more prominent particularly when the first film 21 and the second film 22 are formed thinner than the third film 23 in order to fulfil their respective functions. The thickness of the third film 23 can be in a range of ±25% of $(\lambda/2n_3)\times2$. The $\lambda$ refers to the oscillation wavelength of nitride semiconductor laser element 10, and the $n_3$ refers to the refraction index of the third film 23 with respect to the oscillation wavelength. This can extend the service life of the nitride semiconductor laser element 10 as compared to a third film having a thickness smaller than that. It is likely because the protective film 24 having a larger thickness can extend the time for the damage progressing from the inside of the nitride semiconductor laser element 10 to reach the outer surface of the protective film 24. As shown in FIG. 4, a portion of the protective film can be provided on a side of the upper face side and/or the lower face side of the nitride semiconductor stack body. FIG. 4 shows a cross-sectional view of another example of the nitride semiconductor laser element 10. In this manner, providing the protective film 24 can extend, by the thickness of the protective film 24, the distance for the damage to reach the outer surface of the nitride semiconductor laser element 10 at the upper face side and/or the lower face side of the nitride semiconductor stack body. This can extend the service life of the nitride semiconductor laser element 10. The protective film 24 may further include another film on the outer side of the third film 23. Including such another film results in an increase in the thickness of the protective film 24, and therefore can further extend the service life of the nitride semiconductor laser element 10. As shown in FIG. 5, the protective film 24 can include the fourth film 26 provided on the outer side of the third film 23. FIG. 5 is an enlarged view showing a portion of another example of the protective film 24 at the light-emission-side end face 14 side. The fourth film 26 is disposed on a surface of the third film 23 located opposite to the second film 22 of the protective film 24. The thickness of the fourth film can be larger than the thickness of the third film 23. Providing the fourth film 26 can extend the distance for the damage progressing from the inside of the nitride semiconductor laser element 10 to reach the outer surface of the protective film 24 as compared to a case of providing no fourth film 26. The refractive index of the fourth film 26 with respect to the wavelength oscillation λ can be smaller than the refractive index of the third film 23 with respect to the wavelength oscillation λ. For example, the thickness of the third film 23 can be set in a range of ±20% of $\kappa/2n_3$, and the thickness of the fourth film 26 can be set in a range of ±5% of $\lambda/2n_4$. The symbol "$n_4$" refers to the refractive index of the fourth film 26 with respect to the wavelength oscillation λ. Example of the fourth film 26 includes a film formed of silicone oxide (e.g., $SiO_2$). This can provide an advantage of suppressing initial characterization degradation or suppressing heat generation due to the light absorption. The third film 23 can be disposed as the outermost layer of the protective film 24. In the protective film 24, another film may be provided between the second film 22 and the third film 23.

The third film 23 can be formed by a known method, such as sputtering, ECR sputtering, or the like. It can be formed by using an ECR sputtering system, for example. In the case of forming the first film 21 and the third film 23 by using an ECR sputtering system, the oxygen flow rate during the formation of the third film 23 is lower than the oxygen flow rate during the formation of the first film 21. In this manner, the first film 21 can be formed as a crystalline film, and the third film 23 as a film having an amorphous structure.

With respect to the example of the third film 23 shown in FIG. 2, FIG. 3A confirms that the third film 23 is amorphous, i.e., the third film 23 is a film having an amorphous structure.

The construction described above can reduce the occurrence of catastrophic optical damage in the nitride semiconductor laser element 10, making it possible to extend the service life of the nitride semiconductor laser element 10.

Protective Film 25

A protective film 25 (a second protective film or an additional protective film) is disposed on the light-reflection-side end face 15. The protective film 25 has a film structure different from or the same as that of the protective film 24 provided on the light-emission-side end face 14. The reflectivity of the protective film 25 with respect to the oscillation wavelength of the nitride semiconductor laser element 10 is higher than the reflectivity of the protective film 24 with respect to the oscillation wavelength of the nitride semiconductor laser element 10.

The protective film 25 formed on the light-reflection-side end face 15 may have the same multilayer structure made up of the first film 21, the second film 22, and the third film 23 described above. The protective film 25 may be a Si, Mg, Al, Hf, Nb, Zr, Sc, Ta, Ga, Zn, Y, B, or Ti oxide (particularly, $Al_2O_3$, $SiO_2$, $Nb_2O_5$, $TiO_2$, $ZrO_2$ or the like), a nitride (particularly, AlN, AlGaN, BN, or the like), a fluoride, or a combination of two or more of these. In the case of forming the same multilayer film composed of the first film 21, the second film 22, and the third film 23, the thicknesses of the films may be different from those of the protective film 24 formed on the light-emission-side end face 14. The protective film 25 is preferably formed with a material having transmissivity and/or a material having reflectivity with respect to the oscillation wavelength of the nitride semiconductor laser element 10. The protective film 25 may be a single layer or multiple layers.

Examples of the protective film 25 formed on the light-reflection-side end face 15 include a multilayer film composed of a Si oxide and a Zr oxide, a multilayer film composed of an Al oxide and a Zr oxide, a multilayer film composed of a Si oxide and a Ti oxide, a multilayer film composed of an Al oxide, a Si oxide, and a Zr oxide, a multilayer film composed of a Si oxide, a Ta oxide, and an Al oxide, and the like. The stacking periodicity or the like can be suitably adjusted according to a desired reflectivity.

The thickness of such a protective film 25 is not particularly limited, for example, 100 nm to 4000 nm, 300 nm to 3000 nm, or 500 nm to 2000 nm. For example, the thickness of the protective film 25 is larger than the thickness of the protective film 24.

Figure 6:
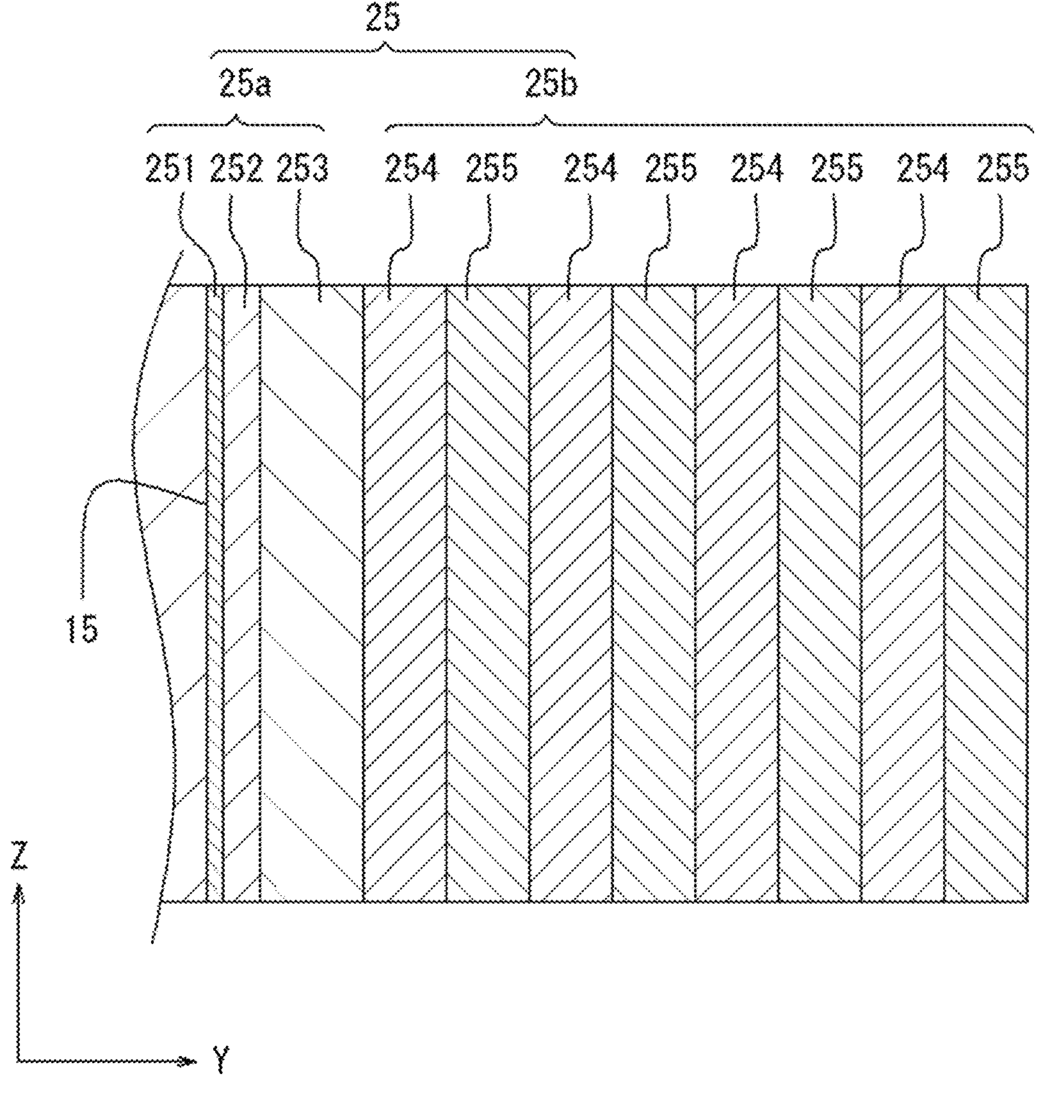
FIG. 6 is an enlarged view showing a portion of another example of a protective film on a side of a light-reflection-side end face.

A protective film 25 is, for example, a multilayer film. A multilayer film can have a structure in which relatively low refractive index films and relatively high refractive index films are alternately stacked. The film in the multilayer film that is in contact with the light-reflection-side end face 15 may have a relatively low or relatively high refractive index. As shown in FIG. 6, the protective film 25 can have a first portion 25*a* disposed in contact with the light-reflection-side end face 15 and a second portion 25*b* disposed in contact with the first portion 25*a*. FIG. 6 is an enlarged view of a portion of an example of the protective film 25 formed on the light-reflection-side end face 15. The thickness of the protective film 25 is preferably λ/4n multiplied by an odd number ±5%, more preferably λ/4n multiplied by an odd number. This can reduce the probability of the occurrence of optical damage at the light-reflection-side end face 15 during the operation of the nitride semiconductor laser element 10. Here, λ is the oscillation wavelength of a semiconductor laser element, and n is the refractive index of each film with respect to the oscillation wavelength λ. The thickness of the protective film 25 refers to the length in the direction parallel to the principal faces of the active layer 13. The second portion 25*b* is composed of high refractive index films 254 and low refractive index films 255 which are alternately disposed. The first portion 25*a* is composed of one or more films. The film in the first portion 25*a* in contact with the second portion 25*b* has a refractive index which is different from the refractive indices of the high refractive index films 254 and the low refractive index films 255. Combining the first portion 25*a* and the second portion 25*b* allows the interface between the first portion 25*a* and the second portion 25*b* to reflect light, thereby increasing the reflectivity of the protective film 25. This can increase the light output of the nitride semiconductor laser element 10. The distance from the light-reflection-side end face 15 to the interface between the first portion 25*a* and the second portion 25*b* is preferably 50 nm to 200 nm. This can further increase the reflectivity of the protective film 25 thereby further increasing the light output of the nitride semiconductor laser element 10. The distance here refers to the shortest distance. The protective film 25 may be composed only of the first portion 25*a* and the second portion 25*b*, or further include another film.

The first portion 25*a* preferably has a multilayer structure having a relatively low refractive index film and a relatively high refractive index film. This can further increase the reflectivity of the protective film 25. For example, a relatively low refractive index film in the first portion 25*a* is disposed in contact with a high refractive index film 254 of the second portion 25*b*. Alternatively, a relatively high refractive index film in the first portion 25*a* may be in contact with a low refractive index film 255 of the second portion 25*b*. The film in the second portion 25*b* that is in contact with the first portion 25*a* is preferably a film having a higher refractive index than the refractive index of the film in the first portion 25*a* that is in contact with the second portion 25*b* as well as a higher refractive index than the refractive index of any of the films in the first portion 25*a*. This can further increase the reflectivity of the protective film 25. The low refractive index films 255 of the second portion 25*b* can be, for example, silicon oxide films (e.g., $SiO_2$ films). The high refractive index films 254 of the second portion 25*b* can be, for example, tantalum oxide films (e.g., $Ta_2O_5$).

The first portion 25*a* may have a fifth film 251, a sixth film 252, and a seventh film 253. The first portion 25*a* may have, successively from the light-reflection-side end face 15 side, a crystalline fifth film 251 containing oxygen and aluminum and/or gallium, a nitride crystalline sixth film 252, and a seventh film 253 containing aluminum and oxygen. For the fifth film 251, the materials, the thickness, and the forming methods described with reference to the first film 21 can be employed. For the sixth film 252, the materials, the thickness, and the forming methods described with reference to the second film 22 can be employed. For the seventh film 253, the materials, the thickness, and the forming methods described with reference to the third film 23 can be employed. Because the first portion 25*a* is the portion in contact with the light-reflection-side end face 15, a similar effect to that achieved by the protective film 24 can be expected by having such a fifth film 251, sixth film 252, and seventh film 253. The fifth film 251 may be disposed in contact with the light-reflection-side end face 15. The thicknesses of the fifth film 251, the sixth film 252, and the seventh film 253 may each be $\lambda/4n$ or smaller. This can position the interface between the first portion 25*a* and the second portion 25*b* relatively close to the light-reflection-side end face 15, thereby further increasing the reflectivity of the protective film 25 and further increasing the light output of the nitride semiconductor laser element 10. For example, the first portion 25*a* is composed only of the fifth film 251, the sixth film 252, and the seventh film 253.

Substrate 16

A substrate 16 may be an insulating substrate or conductive substrate. For the substrate 16, for example, a nitride semiconductor substrate formed of GaN or the like can be used. The first principal face of the substrate 16 which is the semiconductor forming face can be C-plane, R-plane, or M-plane, and is, for example, C-plane. The substrate may have an off-angle of 0° to 10° relative to the first principal face and/or the second principal face located opposite to the first principal face. The thickness of the substrate 16 is, for example, 10 μm to 10 mm.

Embedded Layer 18, First Electrode 17, Second Electrode 19, and Pad Electrode 20

A nitride semiconductor laser element 10 can have an embedded layer 18 on the upper face of the second nitride semiconductor layer 12, e.g., on the lateral faces of the ridge 12*a* and the upper face of the second nitride semiconductor layer 12 contiguous with the lateral faces of the ridge 12*a*.

The embedded layer 18 is preferably formed with a material having a lower refractive index than that of the second nitride semiconductor layer 12. The embedded layer 18 can be a single layer or multilayered insulating film formed of an oxide, nitride, or oxynitride of Zr, Si, V, Hf, Ta, Al, Ce, In, Sb, or Zn. The embedded layer 18 can be formed by using any of the methods known in the art described earlier with reference to the first film 21.

A first electrode 17 can be disposed on the lower face of the first nitride semiconductor layer 11, or if the substrate 16 is provided, on the lower face of the substrate 16. In the case where the substrate 16 is a semiconductor substrate, the substrate 16 is of the same conductivity type as the first nitride semiconductor layer 11. The first electrode 17 is disposed, for example, practically across the entire lower face of the substrate 16.

A second electrode 19 can be disposed on the upper face of the second nitride semiconductor layer 12, for example, on the upper face of the ridge 12*a*, and a pad electrode 20 can be further disposed thereon.

The first electrode 17 and the second electrode 19 can be formed as a single layer or multilayered film of a metal, such as Ni, Rh, Cr, Au, W, Pt, Ti, Al, Pd, or the like, an alloy thereof, or a conductive oxide containing at least one selected from Zn, In, and Sn. Conductive oxide examples include ITO (indium tin oxide), IZO (indium zinc oxide), GZO (gallium-doped zinc oxide), and the like. The thickness of each electrode can be any as long as it can normally function as an electrode for a semiconductor laser element, for example, 0.1 μm to 2 μm.

The first electrode 17 and the second electrode 19 may be respectively disposed on the first principal face side and the second principal face side of the nitride semiconductor stack body, or they may both be disposed on either the first principal face side or the second principal side.

The embedded layer 18, the first electrode 17, the second electrode 19, and the pad electrode 20 may be disposed at a distance from or in contact with the protective film 24 described earlier. The embedded layer 18, the first electrode 17, the second electrode 19, and the pad electrode 20 may cover or be covered by the protective film 24. The embedded layer 18 and the second electrode 19 are preferably covered by the protective film 24. This can reduce the detachment of the embedded layer 18 and the second electrode 19.

EXAMPLES

As a semiconductor laser element shown in FIG. 1A to FIG. 1C, a gallium nitride-based semiconductor laser element having an oscillation wavelength peaking at about 445 nm was produced.

A MOCVD system was used to produce an epitaxial wafer for the semiconductor laser element. For the raw materials, trimethylgallium (TMG), triethylgallium (TEG), trimethylaluminum (TMA), trimethylindium (TMI), ammonia ($NH_3$), silane gas, and bis(cyclopentadienyl)magnesium ($Cp_2Mg$) were suitably used.

On a C-plane n-type GaN substrate (substrate 16), an n-side semiconductor layer as a first nitride semiconductor layer 11, an active layer 13, and a p-side semiconductor layer as a second nitride semiconductor layer 12 were grown, and on the surface of the p-side semiconductor layer, striped ridges 12*a* of 1200 μm in length in the direction parallel to the length of the resonator were formed.

Subsequently, a p-electrode formed of ITO (200 nm) was formed as a second electrode 19 on the surface of the p-side semiconductor layer, and an embedded layer 18 formed of $SiO_2$ was formed on the lateral faces of the ridges 12*a* and the upper face of the p-side semiconductor layer outward from the ridges 12*a*. The embedded layer 18 was formed such that a portion thereof covers the p-electrode.

On the p-electrode, a Ni (8 nm)/Pd (200 nm)/Au (400 nm)/Pt (200 nm)/Au (700 nm) pad electrode 20 was continuously formed.

Subsequently, the substrate 16 was polished from the face opposite the face on which the first nitride semiconductor layer 11 was formed such that the thickness became 80 μm, and on the polished face, a Ti (8 nm)/Pt (100 nm)/Au (300 nm) n-electrode as a first electrode 17 was formed. Then the body is cleaved from the n-electrode side of the substrate 16 into a bar, making the cleaved faces the resonator faces, i.e., the light-emission-side end face 14 and the light-reflection-side end face 15.

Surface treatment was performed on the light-emission-side end face 14 and the light-reflection-side end face 15 of the resultant bar by oxygen plasma exposure using an ECR sputtering system. At this time, the $O_2$ flow rate was set to $3.33\times10^{-7}$ $m^3/s$, treating the bar at 500 W microwave for ten minutes.

Subsequently, an $Al_2O_3$ first film 21 was formed on the light-emission-side end face 14 by using an Al target at a $5\times10^{-7}$ $m^3/s$ Ar flow rate, $1.67\times10^{-7}$ $m^3/s$ oxygen flow rate, and 500 W microwave. In a similar manner, a second film 22 was formed by changing oxygen gas to nitrogen gas, and a third film 23 was formed by changing nitrogen gas to oxygen gas, whereby a protective film 24 was formed. For the semiconductor laser elements in Examples 1 and 2 and Comparative Example, the first film 21, the second film 22, and the third film 23 were formed to have the thicknesses shown in Table 1. For each of the semiconductor laser elements in Examples 1 and 2 and Comparative Example, the reflectivity of the protective film 24 was about 15%. The oxygen flow rate during the formation of the first film 21 was $1.67\times10^{-7}$ $m^3/s$, and the oxygen flow rate during the formation of the third film 23 was $8.33\times10^{-8}$ $m^3/s$. On the light-reflection-side end face 15, a protective film 25 having a multilayer structure in which multiple $SiO_2$ layers and $Ta_2O_5$ layers were alternately stacked was formed.

Subsequently, nitride semiconductor laser elements 10 were obtained by cleaving each bar in the direction perpendicular to the cleaved faces.

TABLE 1

| | Example 1 | Example 2 | Comparative Example |
|---|---|---|---|
| First Film | $Al_2O_3$: 5 nm | $Al_2O_3$: 5 nm | $Al_2O_3$: 5 nm |
| Second Film | AlN: 5 nm | AlN: 16.7 nm | — |
| Third Film | $Al_2O_3$: 142.7 nm | $Al_2O_3$: 117.6 nm | $Al_2O_3$: 147.4 nm |

For Example 1, Example 2, and Comparative Example, seven pieces of semiconductor laser elements were produced each. Life tests were conducted in which the laser elements were allowed to continuously oscillate for about four months at a light density of about 36 $MW/cm^2$, and catastrophic failure pieces were counted.

The results were three for Example 1, zero for Example 2, and five for Comparative Example.

The results confirmed that providing the laser element with the first film 21, the second film 22, and the third film 23 can reduce the occurrence of catastrophic optical damage in the nitride semiconductor laser elements 10. It was further confirmed that this can extend the service life of a nitride semiconductor laser element.

What is claimed is:

1. A nitride semiconductor laser element comprising:

a nitride semiconductor stack body including a first nitride semiconductor layer of a first conductivity type, a second nitride semiconductor layer of a second conductivity type different from the first conductivity type, and an active layer disposed between the first nitride semiconductor layer and the second nitride semiconductor layer, the nitride semiconductor stack body defining first end face intersecting a face of the active layer, and second end face intersecting the face of the active layer;

a first film disposed on the first end face of the nitride semiconductor stack body with the first film being directly in contact with the first end face of the nitride semiconductor stack body, and the first film being a crystalline film containing oxygen and aluminum and/or gallium;

a third film containing aluminum and oxygen; and a second film that is a nitride crystalline film disposed between the first film and the third film, the second film being directly in contact with the third film.

2. The nitride semiconductor laser element according to claim 1, wherein the first film is an oxide film containing aluminum.

3. The nitride semiconductor laser element according to claim 1, wherein the third film is an oxide film containing aluminum.

4. The nitride semiconductor laser element according to claim 1, wherein the second film is an AlN film.

5. The nitride semiconductor laser element according to claim 1, wherein a thickness of the first film is smaller than 10 nm.

6. The nitride semiconductor laser element according to claim 1, wherein a thickness of the third film is three times a thickness of the first film or larger.

7. The nitride semiconductor laser element according to claim 1, wherein each of the first film and the second film is thinner than the third film.

8. The nitride semiconductor laser element according to claim 1, wherein the first film is an insulating film.

9. The nitride semiconductor laser element according to claim 1, wherein the third film is a film having an amorphous structure or a film including both amorphous and crystalline structures.

10. The nitride semiconductor laser element according to claim 1, wherein an axial orientation of a crystal in a region of the second film adjacent to the active layer is the same as at least one of an axial orientation of a crystal in a region of the second film adjacent to the first nitride semiconductor layer and an axial orientation of a crystal in a region of the second film adjacent to the second nitride semiconductor layer.

11. The nitride semiconductor laser element according to claim 1, further comprising:

a fourth film disposed on a surface of the third film located opposite to the second film, wherein a thickness of the fourth film is larger than a thickness of the third film.

12. The nitride semiconductor laser element according to claim 1, further comprising an additional protective film on the second end face, wherein the additional protective film has a first portion in contact with the second end face and a second portion in contact with the first portion, the first portion has a multilayer structure including a relatively low refractive index film and a relatively high refractive index film, the relatively low refractive index film having a refractive index lower than a refractive index of the relatively high refractive index film, and the second portion includes high refractive index films and low refractive index films that are alternately disposed, the high refractive index films having a refractive index higher than the low refractive index films.

13. The nitride semiconductor laser element according to claim 12, wherein the first portion of the additional protective film includes, in the order from the second end face, a fifth film that is a crystalline film containing oxygen and aluminum and/or gallium, a sixth film that is a nitride crystalline film, and a seventh film containing aluminum and oxygen.

14. The nitride semiconductor laser element according to claim 13, wherein the fifth film is an oxide film containing aluminum.

15. The nitride semiconductor laser element according to claim 13, wherein the seventh film is an oxide film containing aluminum.

16. The nitride semiconductor laser element according to claim 13, wherein the sixth film is an AlN film.

17. The nitride semiconductor laser element according to claim 1, wherein the first film is an $Al_2O_3$ film.

18. The nitride semiconductor laser element according to claim 1, wherein the third film is an $Al_2O_3$ film.

19. The nitride semiconductor laser element according to claim 1, wherein the second film is disposed on a surface of the first film, and the third film is disposed on a surface of the second film.

20. A nitride semiconductor laser element comprising:

a nitride semiconductor stack body including a first nitride semiconductor layer of a first conductivity type, a second nitride semiconductor layer of a second conductivity type different from the first conductivity type, and an active layer disposed between the first nitride semiconductor layer and the second nitride semiconductor layer, the nitride semiconductor stack body defining first end face intersecting a face of the active layer, and second end face intersecting the face of the active layer;

a first film disposed on the first end face of the nitride semiconductor stack body with a distance between the first film and the first end face of the nitride semiconductor stack body being 3 nm or smaller, and the first film being a crystalline film containing oxygen and aluminum and/or gallium;

a third film containing aluminum and oxygen; and a second film that is a nitride crystalline film disposed between the first film and the third film, the second film being directly in contact with the third film.

* * * * *